(12) United States Patent
Zurcher et al.

(10) Patent No.: US 6,870,444 B1
(45) Date of Patent: Mar. 22, 2005

(54) ELECTROMECHANICAL RESONATOR AND METHOD OF OPERATING SAME

(75) Inventors: Peter Zurcher, Phoenix, AZ (US); Rashaunda Monique Henderson, Chandler, AZ (US); Sergio Palma Pacheco, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 27 days.

(21) Appl. No.: 10/652,406

(22) Filed: Aug. 28, 2003

(51) Int. Cl.[7] .............................. H03H 9/15; B81B 7/02
(52) U.S. Cl. ..................................... 333/186; 333/197
(58) Field of Search ................................ 333/133, 186, 333/197, 198

(56) References Cited

U.S. PATENT DOCUMENTS

| | | | |
|---|---|---|---|
| 5,491,604 A | 2/1996 | Nguyen et al. | 361/278 |
| 5,640,133 A | 6/1997 | MacDonald et al. | 333/197 |
| 5,955,932 A | 9/1999 | Nguyen et al. | 333/186 |
| 5,976,994 A | 11/1999 | Nguyen et al. | 438/795 |
| 6,169,321 B1 | 1/2001 | Nguyen et al. | 257/536 |
| 6,275,122 B1 | 8/2001 | Speidell et al. | 333/186 |
| 6,374,677 B1 * | 4/2002 | Berlin et al. | 73/662 |
| 6,429,755 B2 | 8/2002 | Speidell et al. | 333/197 |
| 6,630,871 B2 * | 10/2003 | Ma et al. | 331/116 M |
| 6,808,954 B2 * | 10/2004 | Ma et al. | 438/51 |

FOREIGN PATENT DOCUMENTS

WO      WO 01/82477     11/2001

OTHER PUBLICATIONS

Clark, et al.; *UHF Micromechanical Receive Filters; LAB Meeting*, Ann Arbor, Michigan, Oct. 22–23, 2002.

Abdelmoneum, et al.; *Stemless Wine–Glass–Mode Disk Micromechanical Resonators; Center for Integrated Microsystems*, Institute of Electrical and Electronics Engineers, 2003, pp. 698–701.

Clark, et al.; *High–Q VHF Micromechanical Contour–Mode Disk Resonators; Technical Digest*, IEEE Int. Electron Devices Meeting, San Francisco, CA, Dec. 11–13, 2000, pp. 493–496.

* cited by examiner

Primary Examiner—Robert Pascal
Assistant Examiner—Dean Takaoka
(74) Attorney, Agent, or Firm—Bryan Cave LLP

(57) ABSTRACT

An electromechanical resonator includes a substrate (150, 450), an anchor (110, 510, 810) coupled to the substrate, a beam (120, 620, 1020, 1120, 1220, 1420) coupled to the anchor and suspended over the substrate, and a drive electrode (130, 435, 630, 930, 933, 935, 1030, 1035, 1130, 1135, 1435) coupled to the substrate and separated from the beam by a gap (140, 445, 640, 1040, 1045, 1140, 1145, 1445). The beam has a first surface (321, 621, 1021, 1121), a second surface (322, 622), and a third surface (323, 623, 1023, 1123, 1223, 1423). The first surface defines a width and a height, the second surface defines the height and a length, and the third surface defines the length and the width. The width, height, and length are substantially mutually perpendicular, and the beam resonates substantially only in compression mode and substantially only along an axis defined by the length.

31 Claims, 5 Drawing Sheets

US 6,870,444 B1

ELECTROMECHANICAL RESONATOR AND METHOD OF OPERATING SAME

FIELD OF THE INVENTION

This invention relates generally to resonators, and relates more particularly to electromechanical resonators in semiconductor components.

BACKGROUND OF THE INVENTION

Micro-Electro-Mechanical Systems (MEMS) is the integration of mechanical elements and electronics on a common substrate, allowing the realization of a complete system on a single chip. MEMS resonators are passive elements that possess a high quality factor (Q) and that can be used to integrate filtering, oscillator, and other functions on a single chip for applications such as wireless communications systems. As an example, MEMS resonators can advantageously be used at intermediate frequency (IF) and radio frequency (RF) in communications systems based on superheterodyne, quasi-direct conversion, and direct conversion architectures. A MEMS resonator can replace discrete elements, active circuitry, and/or inductor-capacitor (LC) resonators and provide the same functionality with a higher Q, lower power consumption, lower noise, and lower parts count, thus enabling systems with higher performance at lower cost. In existing MEMS resonators, however, the electromechanical coupling decreases as the frequency of the resonator increases, meaning such resonators are increasingly harder to drive at higher frequencies. Accordingly, a need exists for a resonator in which the electromechanical coupling is independent of the resonator frequency.

BRIEF DESCRIPTION OF THE DRAWINGS

The invention will be better understood from a reading of the following detailed description, taken in conjunction with the accompanying figures in the drawings in which.

Figure 1:
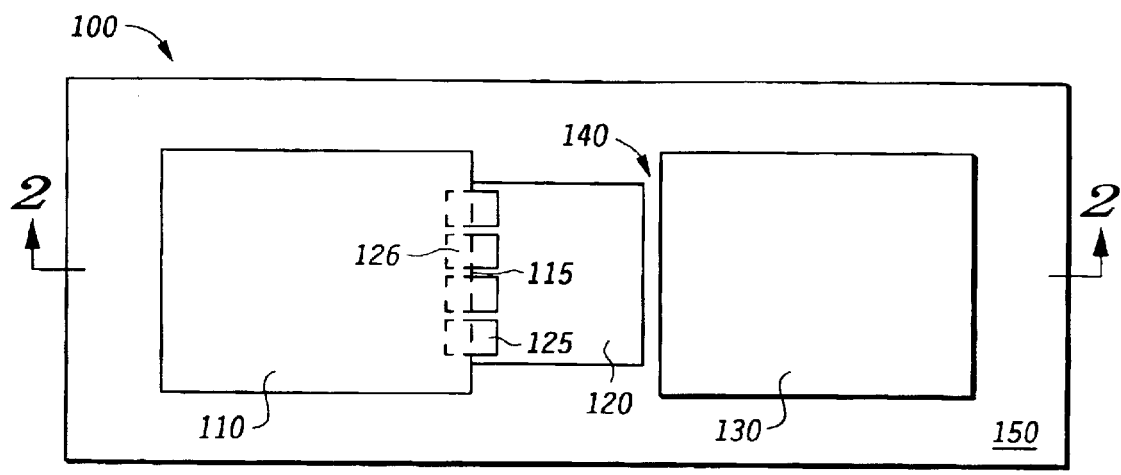
FIG. 1 is a top view of a portion of an electromechanical resonator according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

Referring now to the figures, FIG. 1 is a top view of a portion of an electromechanical resonator 100 according to an embodiment of the invention. Electromechanical resonator 100 comprises a substrate 150, an anchor 110 coupled to substrate 150, a beam 120 coupled to anchor 110 along a boundary line 115 (represented by a dashed line), and a drive electrode 130 coupled to substrate 150 and separated from beam 120 by a gap 140, which, in at least one embodiment, is of a substantially constant size. Beam 120 may optionally comprise holes or indentations 125 along boundary line 115. Alternatively, anchor 110 may optionally comprise holes or indentations 126 along boundary line 115. Indentations 125 and/or indentations 126 (represented by dashed lines) serve to reduce the amount of energy lost to absorption within anchor 110. In one embodiment, electromechanical resonator 100 does not comprise a flexing or resonating arm between anchor 110 and beam 120. Electromechanical resonator 100 can be a MEMS resonator, as is also true of each of the other electromechanical resonators described herein.

Figure 2:
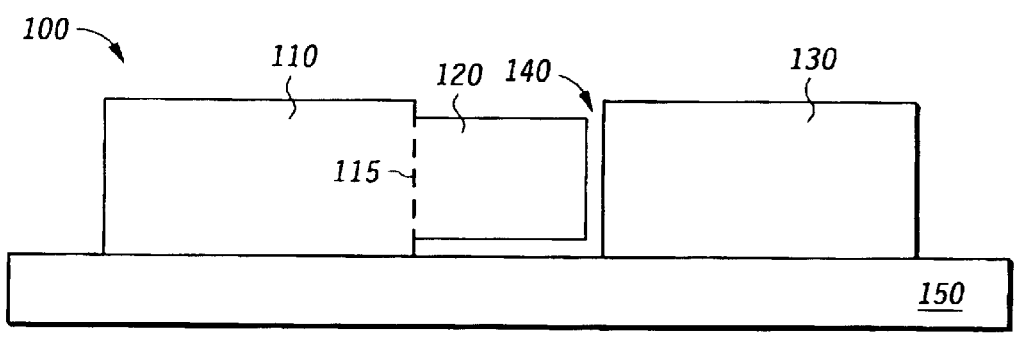
FIG. 2 is a cross-sectional view of the portion of the electromechanical resonator of FIG. 1 taken along a section line 2—2 in FIG. 1.

FIG. 2 is a cross-sectional view of the portion of electromechanical resonator 100 taken along a section line 2—2 in FIG. 1. As illustrated in FIG. 2, beam 120 is suspended over substrate 150. Electrical contact between electromechanical resonator 100 and its support circuitry (not shown) can be accomplished in accordance with methods known in the art. As an example, such electrical contact can be accomplished using electrically conducting vias (not shown). Electrical contact between the other electromechanical resonators described herein can be similar to that described for electromechanical resonator 100.

Figure 3:
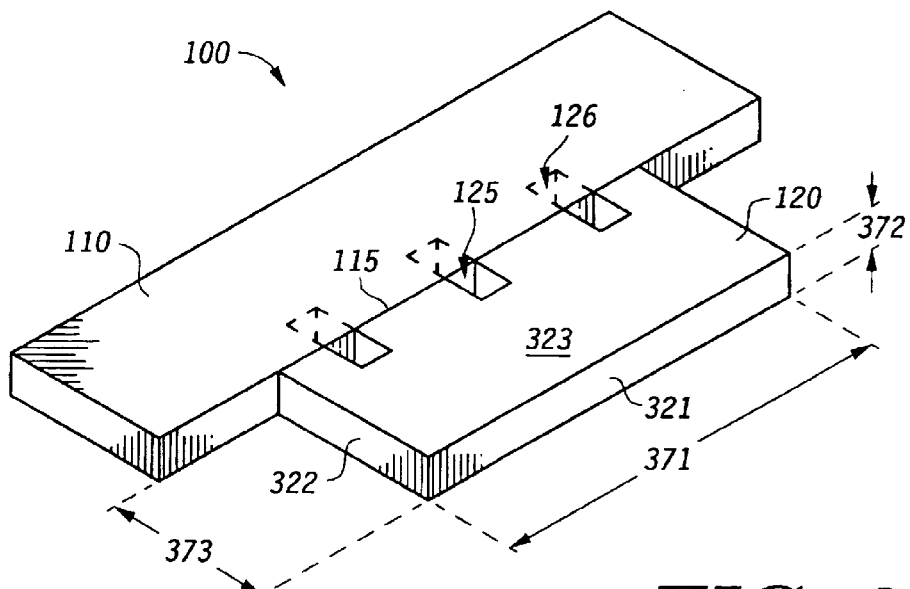
FIG. 3 is an orthogonal view of a portion of the electromechanical resonator of FIG. 1.

FIG. 3 is an orthogonal view of a portion of electromechanical resonator 100. As illustrated in FIG. 3, beam 120 comprises a surface 321, a surface 322, and a surface 323. Surface 321 defines a width 371 and a height 372 for beam 120; surface 322 defines height 372 and a length 373 for beam 120; and surface 323 defines length 373 and width 371 for beam 120. Width 371, height 372, and length 373 are substantially mutually perpendicular to each other. Beam 120 resonates substantially only along an axis defined by length 373 by contracting in a direction away from drive electrode 130 and expanding along the axis in a direction toward drive electrode 130. In the embodiment illustrated in FIGS. 1–3, drive electrode 130 (FIG. 2) is adjacent to surface 321, and beam 120 is coupled to anchor 110 at a surface opposite surface 321. In one embodiment, surface 321 is parallel to the opposing surface of drive electrode 130 (FIG. 2).

The electromechanical coupling and the frequency of electromechanical resonator 100 are independent of each other, and the same is true of each of the other electromechanical resonators described herein. This independence of electromechanical coupling and frequency allows each electromechanical resonator according to embodiments of the invention to be driven at higher frequencies than are possible with existing resonators. More specifically, in at least one embodiment, the frequency of the resonance is inversely proportional to the dimension of the beam in which the beam resonates (the resonance dimension), but does not depend on any other dimension of the beam. On the other hand, the electromechanical coupling of the electromechanical resonator depends on a dimension of the beam other than the resonance dimension and does not depend on the resonance dimension. Accordingly, for each of the electromechanical resonators described herein, the frequency of the resonance can be increased without decreasing the electromechanical coupling. As an example, in the embodiment illustrated in FIGS. 1–3, the frequency of electromechanical resonator 100 is inversely proportional to length 373, while the electromechanical coupling of electromechanical resonator 100 is proportional to width 371.

The biasing of drive electrode 130 (FIG. 2) and beam 120, e.g., via anchor 110, will force beam 120 to move toward and away from drive electrode 130, and to resonate substantially only in compression mode. In one embodiment, the biasing of drive electrode 130 and beam 120 can be superimposed with an RF signal in order to bring about the compression-mode resonance.

Substrate 150 can comprise silicon, and anchor 110, beam 120, and drive electrode 130 can comprise doped polysilicon. Alternatively, substrate 150 can comprise another material, such as ceramic, glass, a semiconductor material, or the like, and beam 120 and drive electrode 130 can comprise another electrically conductive material, such as silicon, metal, or the like, or any combination of an electrically conductive and an electrically non-conductive material such as silicon oxide, silicon nitride, or the like. In one embodiment, anchor 110 also comprises an electrically conductive material.

Figure 4:
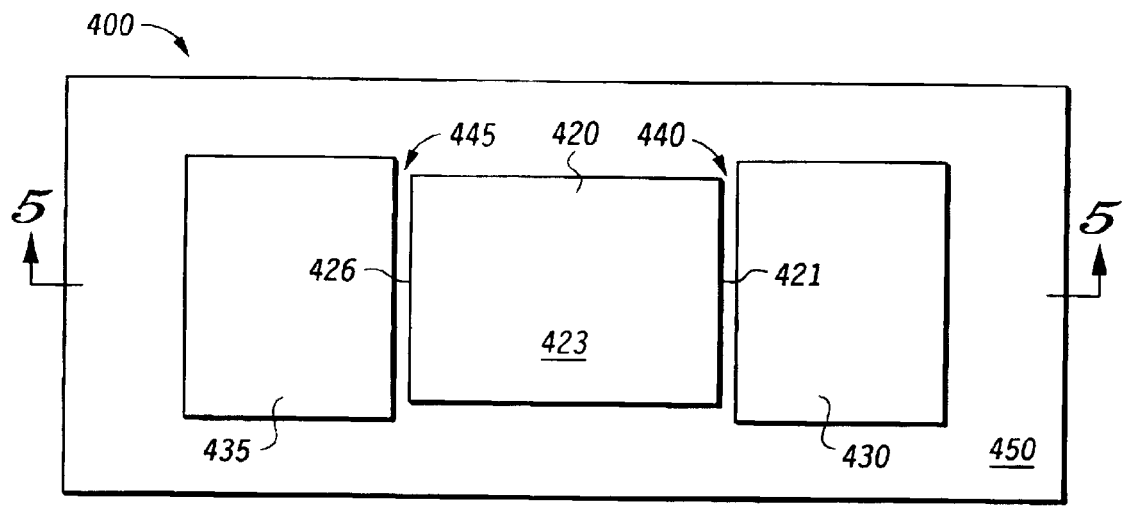
FIG. 4 is a top view of a portion of an electromechanical resonator according to another embodiment of the invention.
Figure 5:
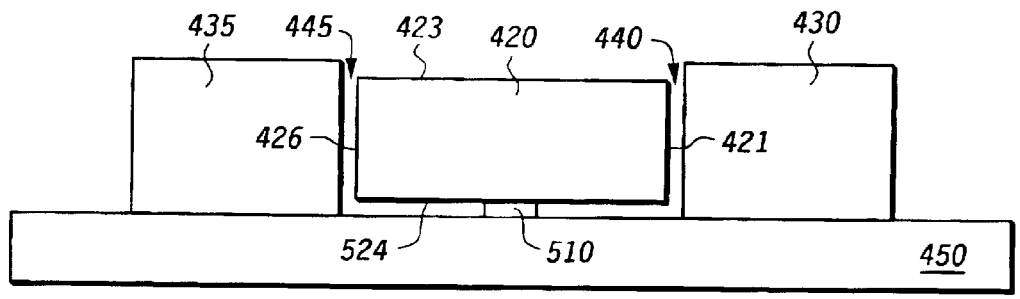
FIG. 5 is a cross-sectional view of the portion of electromechanical resonator of FIG. 4 taken along a section line 5—5 in FIG. 4.

FIG. 4 is a top view of a portion of an electromechanical resonator 400 according to another embodiment of the invention. FIG. 5 is a cross-sectional view of the portion of electromechanical resonator 400 taken along a section line 5—5 in FIG. 4. Referring to FIGS. 4 and 5, electromechanical resonator 400 comprises a substrate 450, an anchor 510 coupled to substrate 450, a beam 420 suspended over substrate 450 and coupled to anchor 510 at a surface 524 of beam 420, a drive electrode 430 coupled to substrate 450 and separated from beam 420 by a gap 440, which is preferably substantially constant in size, and a drive electrode 435 coupled to substrate 450 and separated from beam 420 by a gap 445, which is preferably substantially constant in size. Beam 420 has a surface 421, a surface 426 opposite surface 421, a surface 423, and surface 524 opposite surface 423. Drive electrode 430 is adjacent to, and preferably parallel to, surface 421 of beam 420. Drive electrode 435 is adjacent to, and preferably parallel to, surface 426 of beam 420. Anchor 510 is located between substrate 450 and beam 420.

The biasing of drive electrodes 430 and 435 and of beam 420, e.g., via anchor 510, will force surfaces 421 and 426 of beam 420 to contract toward and expand away from drive electrodes 430 and 435, respectively, along an axis substantially parallel to surface 423 and substantially perpendicular to surfaces 421 and 426, and to resonate substantially only in compression mode. In one embodiment, the biasing of drive electrodes 430 and 435 and of beam 420 can be superimposed with an RF signal in order to bring about the contraction-mode resonance.

The biasing of drive electrodes 430 and 435 in a polarity that is the same as the polarity of the bias applied to beam 420, e.g., via anchor 510, causes surfaces 421 and 426 of beam 420 to contract toward each other along an axis substantially parallel to surface 423 and substantially perpendicular to surfaces 421 and 4256. Surfaces 421 and 426 of beam 420 expand, along the same axis, toward drive electrodes 430 and 435, respectively, to the original length of beam 420 as soon as the contraction caused by drive electrodes 430 and 435 is complete.

Figure 6:
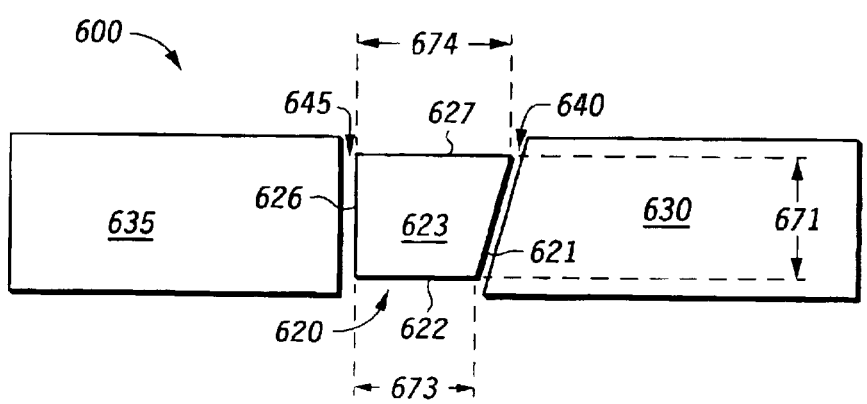
FIG. 6 is a top view of a portion of an electromechanical resonator according to another embodiment of the invention.

FIG. 6 is a top view of a portion of an electromechanical resonator 600 according to an embodiment of the invention. Electromechanical resonator 600 comprises a beam 620, a drive electrode 630 separated from beam 620 by a gap 640, which is preferably substantially constant in size, and a drive electrode 635 separated from beam 620 by a gap 645, which is also preferably substantially constant in size. Beam 620 comprises a surface 621, a surface 626 opposite surface 621, a surface 622, a surface 627 opposite surface 622, and a surface 623. Surfaces 621 and 626 define a width 671. Surfaces 622 and 623 define a length 673, and surfaces 623 and 627 define a length 674 different from length 673 such that surface 623 varies in length across its width. Such variation in length can be substantially continuous, as shown, or can be a stepwise variation.

For simplicity of illustration, additional features of electromechanical resonator 600, such as a substrate, an anchor, and optional indentations, are not shown in FIG. 6, but such additional features can be similar to the corresponding features of embodiments of electromechanical resonator 100 and/or electromechanical resonator 400 shown in the preceding figures. As an example, an anchor of electromechanical resonator 600 can be similar to anchor 510 in FIG. 5. Additionally, the resonance of electromechanical resonator 600 can be similar to the resonance of electromechanical resonator 400, shown in FIGS. 4 and 5. Surface 626 of electromechanical resonator 600 is preferably parallel to the opposing surface of drive electrode 635, and surface 621 is preferably parallel to the opposing surface of drive electrode 630.

It will be understood that the difference between length 673 and length 674 is very small. As an example, the difference in length may represent twenty percent or less of length 673 or of length 674. Accordingly, electromechanical resonator 600 may exhibit a resonance peak in frequency space that is broader than the resonance peak in frequency space of electromechanical resonator 100, first shown in FIG. 1, and electromechanical resonator 400, first shown in FIG. 4. The broadened resonance peak in frequency space is due to the fact that lengths 673 and 674, along with all of the other lengths of surface 623, contribute their own, slightly different resonance-frequency spectrum. An electromechanical resonator having a broadened resonance peak such as is described above may be more useful in applications such as broadband filters than an electromechanical resonator having a more narrow resonance peak.

Some alternate configurations of beams, drive electrodes, and anchors that may also affect resonance peaks in frequency space are shown in FIGS. 10–13. The configurations shown in FIGS. 6 and 10–13 may be thought of as "hardware" resonance tuning methods. At least one non-hardware resonance tuning method is also available, in which a direct-current bias of the electromechanical resonators described herein can be adjusted in order to fine-tune the frequency of the resonance. It will be understood by one of ordinary skill in the art that any electromechanical resonator according to an embodiment of the invention can posses or make use of any of the resonance peak broadening configurations or techniques discussed herein.

Figure 7:
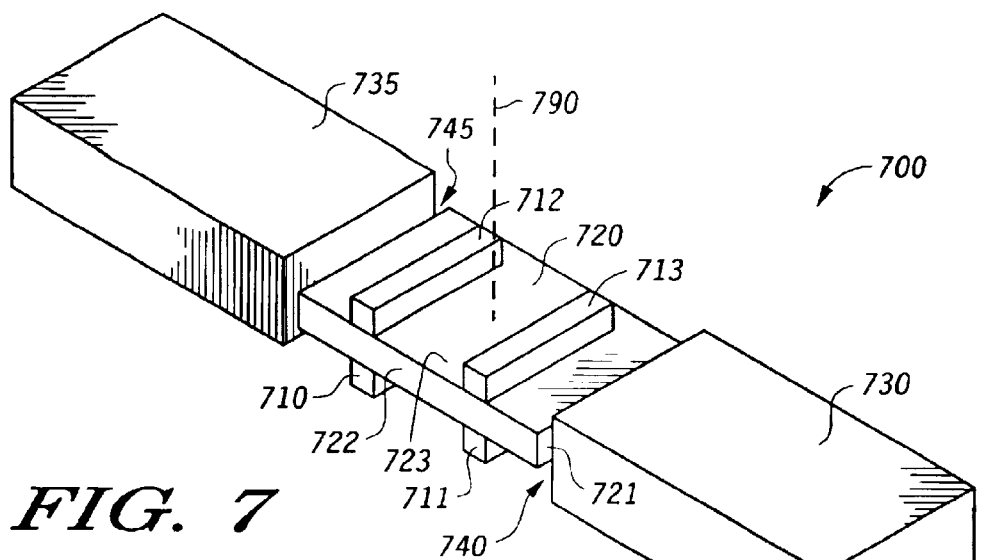
FIG. 7 is an orthogonal view of a portion of an electromechanical resonator according to another embodiment of the invention.

FIG. 7 is an orthogonal view of a portion of an electromechanical resonator 700 according to another embodiment of the invention. Electromechanical resonator 700 comprises an anchor 710, a beam 720 coupled to anchor 710, a drive electrode 730 separated from beam 720 by a gap 740, which is preferably substantially constant in size, and a drive electrode 735 separated from beam 720 by a gap 745, which is preferably substantially constant in size. Beam 720 comprises a surface 721, a surface 722, and a surface 723. Surfaces 721, 722, and 723 can be similar to, respectively, surfaces 321, 322, and 323, first shown in FIG. 3. Drive electrode 730 is adjacent to, and is preferably substantially parallel to, surface 721 of beam 720, and drive electrode 735 is adjacent to, and is preferably substantially parallel to, a surface of beam 720 opposite surface 721. Beam 720 is coupled to anchor 710 at a surface opposite surface 723. For simplicity of illustration, additional features of electromechanical resonator 700, such as a substrate, are not shown in FIG. 7, but can be similar to the corresponding features of embodiments of electromechanical resonator 100 or electromechanical resonator 400 shown in at least some of the preceding figures.

Electromechanical resonator 700 further comprises an anchor 711, an anchor 712, and an anchor 713. Beam 720 is coupled to anchor 711 at the surface opposite surface 723, and is coupled to anchors 712 and 713 at surface 723. In other embodiments, electromechanical resonator 700 can comprise more or fewer anchors than the number of anchors shown in FIG. 7, and any one of the more or fewer anchors can either be adjacent to surface 723 or adjacent to the surface opposite surface 723. This includes an embodiment where all of the anchors, or a single anchor, are adjacent to surface 723 as well as another embodiment where all of the anchors, or a single anchor, are adjacent to the surface opposite surface 723. A line 790 perpendicular to surface 723 of beam 720 defines a vertical direction, and in one embodiment anchors 710 and 712 are aligned in the vertical direction. In the same or another embodiment, anchors 711 and 713 are aligned in the vertical direction. Anchors 712 and 713 can be coupled to a non-illustrated layer of electromechanical resonator 700 located above anchors 712 and 713. As an example, the non-illustrated layer can be similar to substrate 150, first illustrated in FIG. 1. The resonance of electromechanical resonator 700 can be similar to the resonance of electromechanical resonator 400, shown in FIGS. 4 and 5.

Figure 8:
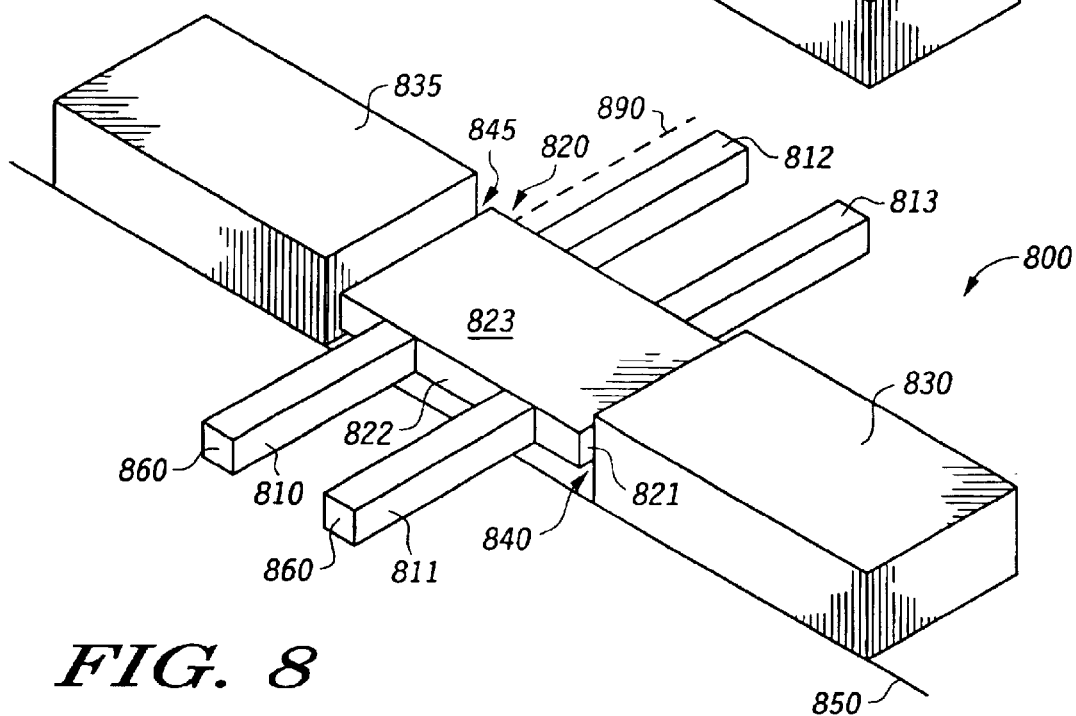
FIG. 8 is an orthogonal view of a portion of an electromechanical resonator according to another embodiment of the invention.

FIG. 8 is an orthogonal view of a portion of an electromechanical resonator 800 according to another embodiment of the invention. Electromechanical resonator 800 comprises an anchor 810, a beam 820 coupled to anchor 810, a drive electrode 830 separated from beam 820 by a gap 840, which is preferably substantially constant in size, a drive electrode 835 separated from beam 820 by a gap 845, which is also preferably substantially constant in size, and a substrate 850, only a portion of which is illustrated. Beam 820 comprises a surface 821, a surface 822, and a surface 823. Surfaces 821, 822, and 823 can be similar to, respectively, surfaces 321, 322, and 323, first shown in FIG. 3. Drive electrode 830 is adjacent to, and is preferably substantially parallel to, surface 821 of beam 820, and drive electrode 835 is adjacent to, and is preferably substantially parallel to, a surface of beam 820 opposite surface 821. Beam 820 is coupled to anchor 810 at surface 822.

Electromechanical resonator 800 further comprises an anchor 811, an anchor 812, and an anchor 813. Beam 820 is coupled to anchor 811 at surface 822, and is coupled to anchors 812 and 813 at the surface opposite surface 822. Free ends 860 of anchors 810, 811, 812, and 813 may be coupled to non-illustrated support blocks, which support blocks may be located above and/or rest on substrate 850. Anchors 810, 811, 812, and 813 are sized such that they do not bend or flex in a direction perpendicular to surface 823 of beam 820. The non-illustrated support blocks may provide an electrical connection to beam 820 through anchors 810, 811, 812, and 813.

In other embodiments, electromechanical resonator 800 can comprise more or fewer anchors than the number of anchors shown in FIG. 8, and any one of the more or fewer anchors can either be adjacent to surface 822 or adjacent to the surface opposite surface 822. This includes an embodiment where all of the anchors, or a single anchor, are adjacent to surface 822 as well as another embodiment where all of the anchors, or a single anchor, are adjacent to the surface opposite surface 822. A line 890 perpendicular to surface 822 of beam 820 defines a horizontal direction, and in one embodiment anchors 810 and 812 are aligned in the horizontal direction. In the same or another embodiment, anchors 811 and 813 are aligned in the horizontal direction. The resonance of electromechanical resonator 800 can be similar to the resonance of electromechanical resonator 400, shown in FIGS. 4 and 5.

Figure 9:
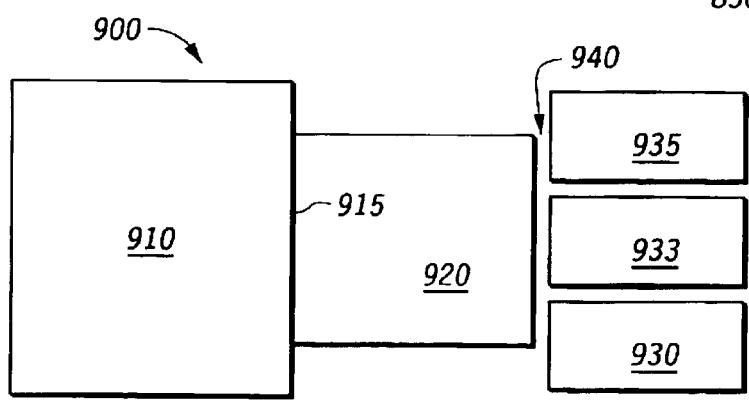
FIG. 9 is a top view of a portion of an electromechanical resonator according to another embodiment of the invention.

FIG. 9 is a top view of a portion of an electromechanical resonator 900 according to another embodiment of the invention. Electromechanical resonator 900 comprises an anchor 910, a beam 920 coupled to anchor 910 along boundary line 915, a drive electrode 930 separated from beam 920 by a gap 940, a drive electrode 933 separated from beam 920 by gap 940, and a drive electrode 935 separated from beam 920 by gap 940. Gap 940 is preferably substantially constant in size between beam 930 and each of drive electrodes 930, 933, and 935. For simplicity of illustration, additional features of electromechanical resonator 900, such as a substrate and optional indentations in anchor 910 or beam 920, are not shown in FIG. 9, but can be similar to the corresponding features of embodiments of electromechanical resonator 100 or electromechanical resonator 400 shown in at least some of the preceding figures. In another embodiment, electromechanical resonator 900 can comprise more or fewer drive electrodes than the number of drive electrodes shown in FIG. 9.

It will be understood by one of ordinary skill in the art that the characteristic of multiple drive electrodes adjacent to at least one single surface of a beam of an electromechanical resonator, which characteristic is first shown in FIG. 9, can be applied to any electromechanical resonator according to embodiments of the invention. For example, in the embodiments of an electromechanical resonator shown in FIGS. 4–8, any one of drive electrodes 130, 430, 435, 630, 635, 730, 735, 830, and 835 can be replaced with two or more drive electrodes, such that one or multiple drive electrodes can be located adjacent to particular surfaces of beams 120, 420, 620, 720, and 820.

Figure 10:
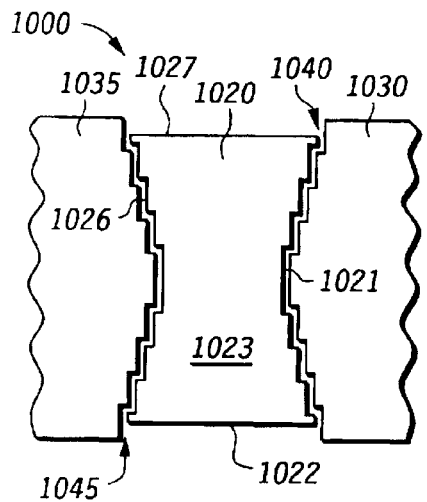
FIG. 10 is a top view of a portion of an electromechanical resonator according to another embodiment of the invention.
Figure 11:
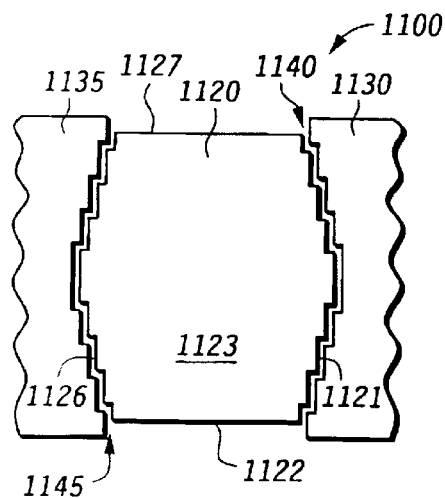
FIG. 11 is a top view of a portion of an electromechanical resonator according to another embodiment of the invention.
Figure 12:
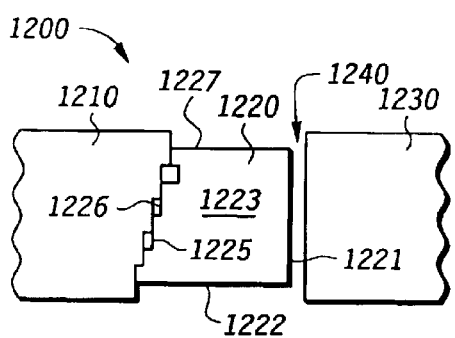
FIG. 12 is a top view of a portion of an electromechanical resonator according to another embodiment of the invention.
Figure 13:
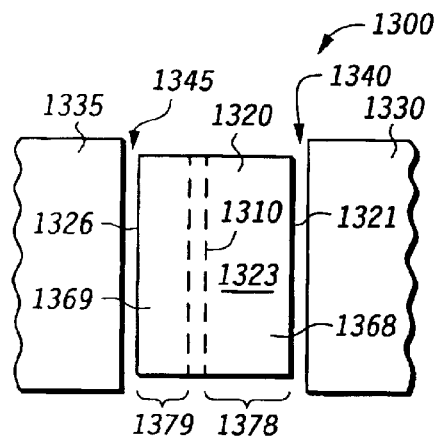
FIG. 13 is a top view of a portion of an electromechanical resonator according to another embodiment of the invention.

FIGS. 10–13 illustrate alternate configurations of beams, drive electrodes, and, in the case of FIGS. 12 and 13, anchors that may affect the resonance peak in frequency space of an electromechanical resonator according to embodiments of the invention. FIGS. 10–13 are representative of a larger number of such alternate configurations, and should not be understood to represent all possibilities of such alternate configurations.

FIG. 10 is a top view of a portion of an electromechanical resonator 1000 according to another embodiment of the invention. Electromechanical resonator 1000 comprises a beam 1020, a drive electrode 1030 separated from beam 1020 by a gap 1040, which is preferably substantially constant in size, and a drive electrode 1035 separated from beam 1020 by a gap 1045, which is also preferably substantially constant in size. Beam 1020 comprises a surface 1021, a surface 1026 opposite surface 1021, a surface 1022, a surface 1027 opposite surface 1022, and a surface 1023. Surface 1026 of beam 1020 is preferably conformal and substantially parallel to the opposing surface of drive electrode 1035. Similarly, surface 1021 of beam 1020 is preferably conformal and substantially parallel to the opposing surface of drive electrode 1030.

A length of beam 1020 is measured between surface 1021 and surface 1026, and a width of beam 1020 is measured between surface 1022 and surface 1027. As illustrated in FIG. 10, the length of beam 1020 varies across the width of beam 1020. Such variation in length can be stepwise, as shown, or can be a substantially continuous variation. As an example, electromechanical resonator 1000 can be anchored in a manner similar to that shown for, e.g., electromechanical resonators 400, 700, and 800 in FIGS. 4 and 5, 7, and 8, respectively. Additionally, the resonance of electromechanical resonator 1000 can be similar to the resonance of electromechanical resonator 400, shown in FIGS. 4 and 5.

FIG. 11 is a top view of a portion of an electromechanical resonator 1100 according to another embodiment of the invention. Electromechanical resonator 1100 comprises a beam 1120, a drive electrode 1130 separated from beam 1120 by a gap 1140, which is preferably substantially constant in size, and a drive electrode 1135 separated from beam 1120 by a gap 1145, which is also preferably substantially constant in size. Beam 1120 comprises a surface 1121, a surface 1126 opposite surface 1121, a surface 1122, a surface 1127 opposite surface 1122, and a surface 1123. Surface 1126 of beam 1120 is preferably conformal and substantially parallel to the opposing surface of drive electrode 1135. Similarly, surface 1121 of beam 1120 is preferably conformal and substantially parallel to the opposing surface of drive electrode 1130.

A length of beam 1120 is measured between surface 1121 and surface 1126, and a width of beam 1120 is measured between surface 1122 and surface 1127. As illustrated in FIG. 11, the length of beam 1120 varies across the width of beam 1120. Such variation in length can be stepwise, as shown, or can be a substantially continuous variation. As an example, electromechanical resonator 1100 can be anchored in a manner similar to that shown for, e.g., electromechanical resonators 400, 700, and 800 in FIGS. 4 and 5, 7, and 8, respectively. Additionally, the resonance of electromechanical resonator 1100 can be similar to the resonance of electromechanical resonator 400, shown in FIGS. 4 and 5.

FIG. 12 is a top view of a portion of an electromechanical resonator 1200 according to another embodiment of the invention. Electromechanical resonator 1200 comprises an anchor 1210, a beam 1220 coupled to anchor 1210, and a drive electrode 1230 separated from beam 1220 by a gap 1240, which is preferably substantially constant in size. Beam 1220 comprises a surface 1221, a surface 1226 opposite surface 1221, a surface 1222, a surface 1227 opposite surface 1222, and a surface 1223. Surface 1221 is preferably substantially parallel to the opposing surface of drive electrode 1230. A length of beam 1220 is measured between surface 1221 and surface 1226, and a width of beam 1220 is measured between surface 1222 and surface 1227. As illustrated in FIG. 12, the length of beam 1220 varies across the width of beam 1220. Such variation in length can be stepwise, as shown, or can be a substantially continuous variation. Beam 1220 may optionally comprise indentations 1225. Indentations 1225 can be similar to indentations 125, first shown in FIG. 1. Alternatively, anchor 1210 may include indentations in a manner similar to anchor 110 in FIG. 1. The resonance of electromechanical resonator 1200 can be similar to the resonance of electromechanical resonator 100, first shown in FIG. 1.

FIG. 13 is a top view of a portion of an electromechanical resonator 1300 according to another embodiment of the invention. Electromechanical resonator 1300 comprises a beam 1320 coupled to anchor 1310, a drive electrode 1330 separated from beam 1320 by a gap 1340, which is preferably substantially constant in size, and a drive electrode 1335 separated from beam 1320 by a gap 1345, which is also preferably substantially constant in size. Beam 1320 comprises a surface 1321, a surface 1326 opposite surface 1321, and a surface 1323. Electromechanical resonator 1300 also comprises an anchor 1310 (shown in broken lines to indicate that it is under surface 1323). Beam 1320 further comprises a portion 1368 and a portion 1369 located at opposite sides of anchor 1310, where portion 1368 has a length 1378 that is different from a length 1379 of portion 1369.

Figure 14:
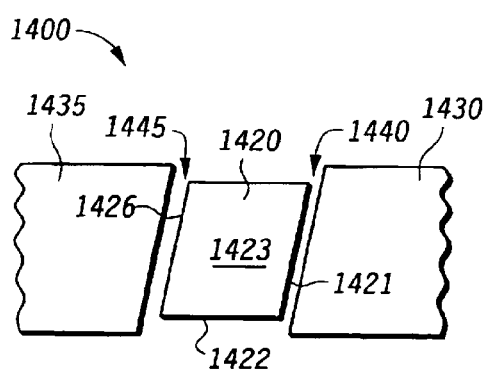
FIG. 14 is a top view of a portion of an electromechanical resonator according to another embodiment of the invention.

FIG. 14 is a top view of a portion of an electromechanical resonator 1400 according to another embodiment of the invention. Electromechanical resonator 1400 comprises a beam 1420, a drive electrode 1430 separated from beam 1420 by a gap 1440, which is preferably substantially constant in size, and a drive electrode 1435 separated from beam 1420 by a gap 1445, which is also preferably substantially constant in size. Beam 1420 comprises a surface 1421, a surface 1426 opposite surface 1421, a surface 1422, and a surface 1423. Note that in the embodiment illustrated in FIG. 14, surfaces 1422 and 1426 of beam 1420 are not substantially perpendicular to each other. However, the opposing surfaces of drive electrode 1430 and drive electrode 1435 are still substantially parallel to surfaces 1421 and 1426, respectively. As an example, electromechanical resonator 1400 can be anchored in a manner similar to that shown for, e.g., electromechanical resonators 400, 700, and 800 in FIGS. 4 and 5, 7, and 8, respectively. Additionally, the resonance of electromechanical resonator 1400 can be similar to the resonance of electromechanical resonator 400, shown in FIGS. 4 and 5.

Figure 15:
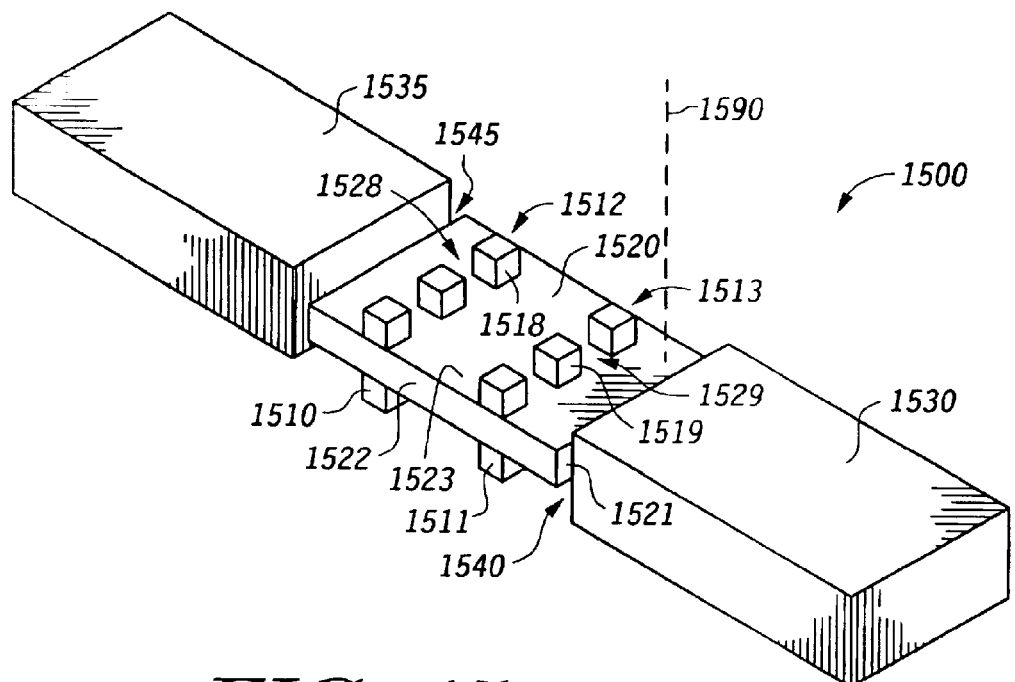
FIG. 15 is an orthogonal view of a portion of an electromechanical resonator according to an embodiment of the invention.

FIG. 15 is an orthogonal view of an electromechanical resonator 1500 according to another embodiment of the invention. Electromechanical resonator 1500 comprises an anchor 1510, a beam 1520 coupled to anchor 1510, a drive electrode 1530 separated from beam 1520 by a gap 1540, which is preferably substantially constant in size, and a drive electrode 1535 separated from beam 1520 by a gap 1545, which is also preferably substantially constant in size. Beam 1520 comprises a surface 1521, a surface 1522, and a surface 1523. Surfaces 1521, 1522, and 1523 can be similar to, respectively, surfaces 321, 322, and 323, first shown in FIG. 3. Drive electrode 1530 is adjacent to, and is preferably substantially parallel to, surface 1521 of beam 1520, and drive electrode 1535 is adjacent to, and is preferably substantially parallel to, a surface of beam 1520 opposite surface 1521. Beam 1520 is coupled to anchor 1510 at a surface opposite surface 1523. For simplicity of illustration, additional features of electromechanical resonator 1500, such as a substrate, are not shown in FIG. 15, but can be similar to the corresponding features of embodiments of electromechanical resonator 100 or electromechanical resonator 400 shown in at least some of the preceding figures.

Electromechanical resonator 1500 further comprises an anchor 1511, an anchor 1512, and an anchor 1513. Beam 1520 is coupled to anchor 1511 at the surface opposite surface 1523, and is coupled to anchors 1512 and 1513 at surface 1523. In other embodiments, electromechanical resonator 1500 can comprise more or fewer anchors than the number of anchors shown in FIG. 15, and any one of the more or fewer anchors can either be adjacent to surface 1523 or adjacent to the surface opposite surface 1523. This includes an embodiment where all of the anchors, or a single anchor, are adjacent to surface 1523 as well as another embodiment where all of the anchors, or a single anchor, are adjacent to the surface opposite surface 1523. A line 1590 perpendicular to surface 1523 of beam 1520 defines a vertical direction, and in one embodiment anchors 1510 and 1512 are aligned in the vertical direction. In the same or another embodiment, anchors 1511 and 1513 are aligned in the vertical direction. Anchors 1512 and 1513 can be coupled to a non-illustrated layer of electromechanical resonator 1500 located above anchors 1512 and 1513. As an example, the non-illustrated layer can be similar to substrate 150, first illustrated in FIG. 1.

Anchor 1512 comprises a plurality of anchor segments 1518, and anchor 1513 comprises a plurality of anchor segments 1519. Electromechanical resonator 1500 further comprises a plurality of anchor gaps 1528 and 1529. Adjacent ones of anchor segments 1518 are separated by one of the plurality of anchor gaps 1528, and adjacent ones of anchor segments 1519 are separated by one of the plurality of anchor gaps 1529. Anchors 1512 and 1513, being segmented as shown and described, serve to reduce the amount of energy lost to absorption within anchor 110 in a manner similar to indentations 125 and/or indentations 126, first shown in FIG. 1. It will be understood that any one, or all, of the anchors that form a part of electromechanical resonator 1500, including anchors 1510, 1511, 1512, and 1513 can be segmented. The resonance of electromechanical resonator 600 can be similar to the resonance of electromechanical resonator 400, shown in FIGS. 4 and 5.

Figure 16:
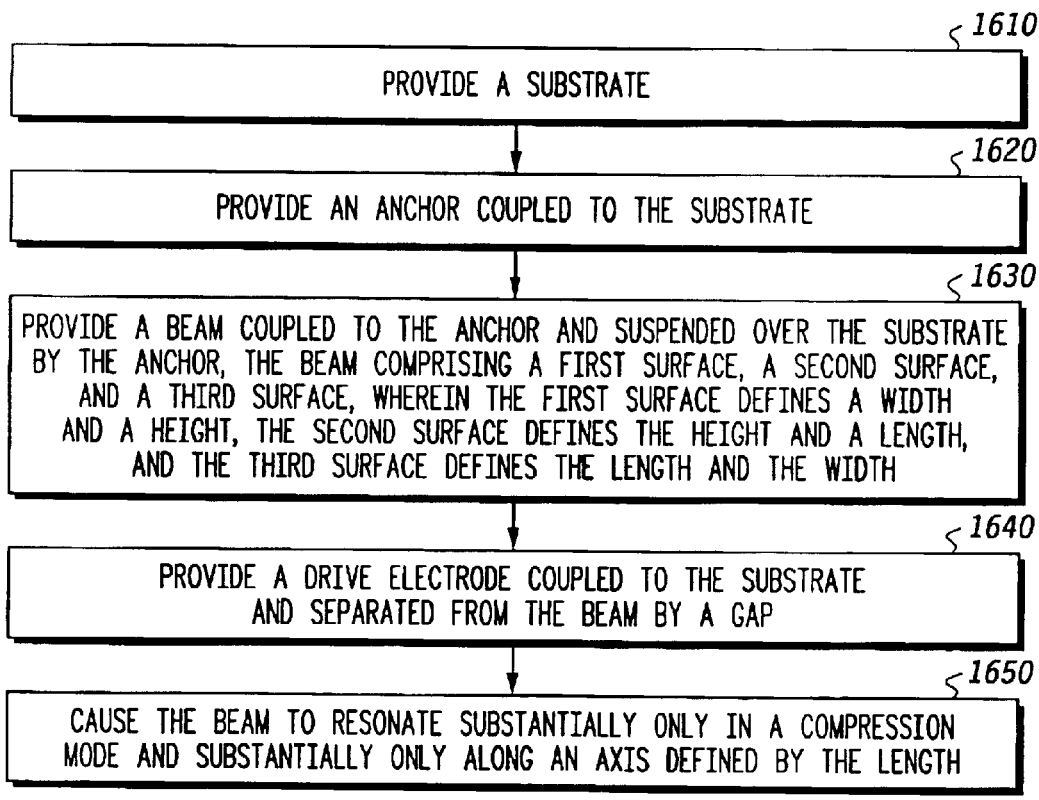
FIG. 16 is a flowchart illustrating a method of operating an electromechanical resonator according to an embodiment of the invention.

FIG. 16 is a flowchart illustrating a method 1600 of operating an electromechanical resonator according to an embodiment of the invention. A step 1610 of method 1600 is to provide a substrate. As an example, the substrate can be similar to substrates 150, 450, or 850, first shown in FIGS. 1, 4, and 8, respectively.

A step 1620 of method 1600 is to provide an anchor coupled to the substrate. As an example, the anchor can be similar to anchor 110, first shown in FIG. 1, anchor 510, first shown in FIG. 5, anchors 710, 711, 712, or 713, first shown in FIG. 7, anchors 810, 811, 812, or 813, first shown in FIG. 8, anchor 910, first shown in FIG. 9, anchor 1210, first shown in FIG. 12, or anchors 1510, 1511, 1512, or 1513, first shown in FIG. 15.

A step 1630 of method 1600 is to provide a beam coupled to the anchor and suspended over the substrate by the anchor, the beam comprising a first surface, a second surface, and a third surface, wherein the first surface defines a width and a height, the second surface defines the height and a length, and the third surface defines the length and the width. As an example, the beam can be similar to beam 120, first shown in FIG. 1, beam 420, first shown in FIG. 4, beam 620, first shown in FIG. 6, beam 720, first shown in FIG. 7, beam 820, first shown in FIG. 8, beam 920, first shown in FIG. 9, beam 1020, first shown in FIG. 10, beam 1120, first shown in FIG. 11, beam 1220, first shown in FIG. 12, beam 1320, first shown in FIG. 13, beam 1420, first shown in FIG. 14, or beam 1520, first shown in FIG. 15.

A step 1640 of method 1600 is to provide a drive electrode coupled to the substrate and separated from the beam by a gap. As an example, the drive electrode can be similar to drive electrode 130, first shown in FIG. 1, drive electrodes 430 or 435, first shown in FIG. 4, drive electrodes 630 or 635, first shown in FIG. 6, drive electrodes 730 or 735, first shown in FIG. 7, drive electrode 830 or 835, first shown in FIG. 8, drive electrodes 930, 933, or 935, first shown in FIG. 9, drive electrodes 1030 or 1035, first shown in FIG. 10, drive electrodes 1130 or 1135, first shown in FIG. 11, drive electrode 1230, first shown in FIG. 12, drive electrodes 1330 or 1335, first shown in FIG. 13, drive electrodes 1430 or 1435, first shown in FIG. 14, or drive electrodes 1530 or 1535, first shown in FIG. 15.

A step 1650 of method 1600 is to cause the beam to resonate substantially only in a compression mode and substantially only along an axis defined by the length. As an example, the beam may be caused to so resonate by biasing the drive electrode and the beam, e.g., via the anchor. Such biasing forces the beam to move toward or away from the drive electrode(s), and facilitates the resonance substantially only in compression mode. In one embodiment, the biasing of the drive electrode and the beam can be superimposed with an RF signal in order to bring about the contraction-mode resonance.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the electromechanical resonator discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An electromechanical resonator comprising:
   a substrate;
   an anchor coupled to the substrate;
   a beam coupled to the anchor and suspended over the substrate by the anchor, the beam comprising a first surface, a second surface, and a third surface; and
   a drive electrode coupled to the substrate and separated from the beam by a gap,
   wherein:
      the first surface defines a width and a height, the second surface defines the height and a length, and the third surface defines the length and the width; and
      the beam resonates substantially only in a compression mode and substantially only along an axis defined by the length.

2. The electromechanical resonator of claim 1 wherein: the width, height, and length are substantially mutually perpendicular to each other.

3. The electromechanical resonator of claim 1 wherein: the drive electrode is adjacent to the first surface; and the beam is coupled to the anchor at a surface of the beam opposite the first surface.

4. The electromechanical resonator of claim 3 wherein: the beam comprises at least one indentation in the surface opposite the first surface.

5. The electromechanical resonator of claim 3 wherein: the anchor comprises at least one indentation adjacent to the surface opposite the first surface.

6. The electromechanical resonator of claim 1 wherein: the drive electrode comprises a first drive electrode; to the electromechanical resonator further comprises a second drive electrode;
the first drive electrode is adjacent to the first surface; the second drive electrode is adjacent to a surface of the beam opposite the first surface;
the anchor is located between the substrate and the beam; and
the beam is coupled to the anchor at a surface of the beam opposite the third surface.

7. The electromechanical resonator of claim 6 wherein: the electromechanical resonator further comprises:
   a second anchor coupled to the beam at the third surface.

8. The electromechanical resonator of claim 1 wherein: the drive electrode comprises a first drive electrode; the electromechanical resonator further comprises a second drive electrode;
the first drive electrode is adjacent to the first surface; the second drive electrode is adjacent to a surface of the beam opposite the first surface; and
the beam is coupled to the anchor at the third surface.

9. The electromechanical resonator of claim 7 wherein: a line perpendicular to the third surface defines a vertical direction; and
the anchor and the second anchor are aligned in the vertical direction.

10. The electromechanical resonator of claim 7 wherein: the anchor comprises a plurality of anchor segments and a plurality of anchor gaps; and
adjacent ones of the anchor segments are spaced apart by one of the plurality of anchor gaps.

11. The electromechanical resonator of claim 6 wherein: the length of the third surface varies across the width of the third surface.

12. The electromechanical resonator of claim 11 wherein: the anchor comprises a plurality of anchor segments and a plurality of anchor gaps; and
adjacent ones of the anchor segments are spaced apart by one of the plurality of anchor gaps.

13. The electromechanical resonator of claim 1 wherein: the drive electrode comprises a first drive electrode; the electromechanical resonator further comprises a second drive electrode;
the first drive electrode is adjacent to the first surface; the second drive electrode is adjacent to a surface of the beam opposite the first surface; and
the beam is coupled to the anchor at the second surface.

14. The electromechanical resonator of claim 13 wherein: the electromechanical resonator further comprises:
   a second anchor coupled to the beam at a surface of the beam opposite the second surface.

15. The electromechanical resonator of claim 14 wherein: a line perpendicular to the second surface defines a horizontal direction; and
the anchor and the second anchor are aligned in the horizontal direction.

16. The electromechanical resonator of claim 1 wherein: the drive electrode comprises a first drive electrode; the electromechanical resonator further comprises a second drive electrode;
the first drive electrode is adjacent to the first surface; the second drive electrode is adjacent to a surface of the beam opposite the first surface; and
the beam is coupled to the anchor at a surface of the beam opposite the second surface.

17. The electromechanical resonator of claim 13 wherein: the length of the third surface varies across the width of the third surface.

18. The electromechanical resonator of claim 1 wherein: the length of the third surface varies across the width of the third surface; and
the beam is coupled to the anchor at a surface opposite the first surface.

19. The electromechanical resonator of claim 18 wherein:
the beam comprises at least one indentation in the surface opposite the first surface.

20. The electromechanical resonator of claim 18 wherein:
the anchor comprises at least one indentation adjacent to the surface opposite the first surface.

21. A MEMS resonator comprising:
a semiconductor substrate having a substrate surface;
an anchor coupled to the substrate;
a beam coupled to the anchor and suspended over the substrate surface by the anchor, the beam comprising a first surface substantially perpendicular to the substrate surface, a second surface substantially perpendicular to the substrate surface, and a third surface substantially parallel to the substrate surface;
a first drive electrode coupled to the substrate and separated from the beam by a first gap; and
a second drive electrode coupled to the substrate and separated from the beam by a second gap,
wherein:
  the first drive electrode is adjacent to the first surface;
  the second drive electrode is adjacent to a surface of the beam opposite the first surface;
  the first surface defines a width and a height, the second surface defines the height and a length, and the third surface defines the length and the width;
  the width, height, and length are substantially mutually perpendicular to each other; and
  the beam resonates substantially only in a compression mode and substantially only along an axis defined by the length.

22. The MEMS resonator of claim 21 wherein:
the anchor is located between the substrate and the beam; and
the beam is coupled to the anchor at a surface of the beam opposite the third surface.

23. The MEMS resonator of claim 22 wherein:
the anchor comprises a plurality of anchor segments and a plurality of anchor gaps; and
adjacent ones of the anchor segments are spaced apart by one of the plurality of anchor gaps.

24. The MEMS resonator of claim 22 wherein:
the MEMS resonator further comprises:
  a second anchor coupled to the beam at the third surface.

25. The MEMS resonator of claim 24 wherein:
a line perpendicular to the third surface defines a vertical direction; and
the anchor and the second anchor are aligned in the vertical direction.

26. The MEMS resonator of claim 24 wherein:
at least one of the first anchor and the second anchor comprises a plurality of anchor segments and a plurality of anchor gaps; and
adjacent ones of the anchor segments are spaced apart by one of the plurality of anchor gaps.

27. The MEMS resonator of claim 21 wherein:
the length of the third surface varies across the width of the third surface.

28. The MEMS resonator of claim 21 wherein:
the beam is coupled to the anchor at the second surface.

29. The MEMS resonator of claim 28 wherein:
the MEMS resonator further comprises:
  a second anchor coupled to the beam at a surface of the beam opposite the second surface.

30. The MEMS resonator of claim 29 wherein:
a line perpendicular to the second surface defines a horizontal direction; and
the anchor and the second anchor are aligned in the horizontal direction.

31. A method of operating an electromechanical resonator, the method comprising:
providing a substrate;
providing an anchor coupled to the substrate;
providing a beam coupled to the anchor and suspended over the substrate by the anchor, the beam comprising a first surface, a second surface, and a third surface, wherein the first surface defines a width and a height, the second surface defines the height and a length, and the third surface defines the length and the width;
providing a drive electrode coupled to the substrate and separated from the beam by a gap; and
causing the beam to resonate substantially only in a compression mode and substantially only along an axis defined by the length.

* * * * *

UNITED STATES PATENT AND TRADEMARK OFFICE
CERTIFICATE OF CORRECTION

PATENT NO. : 6,870,444 B1 Page 1 of 1
DATED : March 22, 2005
INVENTOR(S) : Zurcher et al.

It is certified that error appears in the above-identified patent and that said Letters Patent is hereby corrected as shown below:

Column 11,
Line 56, the word "to" should be deleted.

Signed and Sealed this

Ninth Day of August, 2005

JON W. DUDAS
*Director of the United States Patent and Trademark Office*